United States Patent [19]

Ellett et al.

[11] Patent Number: 4,513,190
[45] Date of Patent: Apr. 23, 1985

[54] PROTECTION OF SEMICONDUCTOR WIRE BONDING CAPILLARY FROM SPARK EROSION

[75] Inventors: Kenneth W. Ellett, San Rafael, Calif.; Peter Glutz, Lyss, Switzerland

[73] Assignee: Small Precision Tools, Inc., San Rafael, Calif.

[21] Appl. No.: 455,038

[22] Filed: Jan. 3, 1983

[51] Int. Cl.³ .............................................. B23K 11/32
[52] U.S. Cl. ................... 219/56.21; 228/179; 228/1.1
[58] Field of Search .................... 219/56.21, 56.22; 174/142; 228/179, 1 R

[56] References Cited

U.S. PATENT DOCUMENTS 4,315,128  2/1982  Matcovich et al. ................. 228/179

FOREIGN PATENT DOCUMENTS 1056362  1/1967  United Kingdom ................. 228/179

Primary Examiner—Clifford C. Shaw
Attorney, Agent, or Firm—Jay M. Cantor

[57] ABSTRACT

A wire bonding capillary of a hard, normally electrically non-conductive material wherein surfaces of the capillary are coated with a thin electrically conductive material for protecting the capillary bonding face from spark erosion damage and reduction in carbon-like material build-up inside the inner taper of the capillary bore by conduction of current from an electronic flame-off (EFO) torch through a low resistance path to ground.

19 Claims, 5 Drawing Figures

4,513,190

PROTECTION OF SEMICONDUCTOR WIRE BONDING CAPILLARY FROM SPARK EROSION

BACKGROUND OF THE INVENTION

This invention relates to the protection of wire bonding capillaries, used in the bonding of wire between pads on a semiconductor die and leads on a die carrier, from spark erosion and carbon-like material build-up due to spark discharge from an electronic flame-off (EFO) torch.

BRIEF DESCRIPTION OF THE PRIOR ART

In the manufacture of semiconductor devices, it is normal practice to place the active smiconductor device, known as a chip or die, into a package or die carrier. Connection between the die and the package is made by means of electrically conductive leads connected between die bond pads on the die and leads on the package itself. Depending upon the type of semiconductor device involved, the connection between die bond pads and package lead is made via very thin wires which are bonded to the pad and lead, the wires being on the order of 25 microns and the like for normal semiconductor devices and up to about 500 microns for high powered devices. The wire itself, which is bonded to the pads and leads, is usually gold or aluminum. Several well known techniques are known for bonding the wire between the die bond pad and the package lead, the discussion herein being limited to three specific types of such bonding, namely, (1) thermocompression tailless gold ball and stitch bonding, (2) thermosonic tailless gold ball and stitch bonding and (3) ultrasonic or thermosonic tailless aluminum ball and stitch bonding. These well known bonding techniques are described in *Precision 79 Semiconductor Bonding Handbook*, published by Small Precision Tools, Inc., San Rafael, Calif.

During the bonding process in the above noted bonding techniques, after a wire has been bonded between a die bond pad and a package lead, the wire is broken off at the last made bond and a ball is then formed at the end of the wire from the wire feeder for the next bonding step.

At present, the ball is formed by use of an electronic flame-off (EFO) torch as will be explained hereinbelow. However, prior to the EFO, a small hydrogen flame-off torch was used. When the small hydrogen flame-off torch was used to form balls, the main cause for a wire bonding capillary to wear out was primarily abrasive wear. Capillary tool life of over one million bonds with ceramic capillaries was common. However, with the advent of the EF0, typical capillary life of ceramic capillaries dropped to less than one half million bonds. The main reason for the decrease in capillary bonding tool life was no longer abrasive wear but rather spark erosion damage on the capillary bonding face and build-up of carbon-like material within the bore of the capillary.

SUMMARY OF THE INVENTION

In accordance with the present invention, the above described problems of spark erosion damage on the capillary bonding face and carbon-like material build-up within the capillary bore are minimized during ball formation using an EFO. Briefly, this is accomplished by coating the bore and the entire outer surface of the capillary with a layer of an electrically conductive material and connecting the layer to a source of reference potential so that discharge current from the EFO can be led away from the capillary rapidly and prevent the undesirable spark erosion damage and carbon-like material build-up.

BRIEF DESCRIPTION OF THE DRAWINGS

Referring now to FIG. 1, there is shown a typical prior art capillary 23 which is formed of fine grain high alumina ceramic containing about 99.8% $Al_2O_3$, beryllium oxide, glass, quartz, polycrystalline ruby or sapphire, corundum-system precious stone such as ruby or sapphire or other known wire bonding capillary materials. The wire bonding capillary 23 is held in a wire bonding machine by a heated capillary holder or ultrasonic transducer 24. A bonding wire 25, which is preferably of gold, passes through the hollow bore of the capillary having inner taper 15 and capillary bore 17. It should be understood that other metallic wires, such as aluminum, aluminum alloys, palladium, copper and copper alloys have been successfully used.

Figure 1:
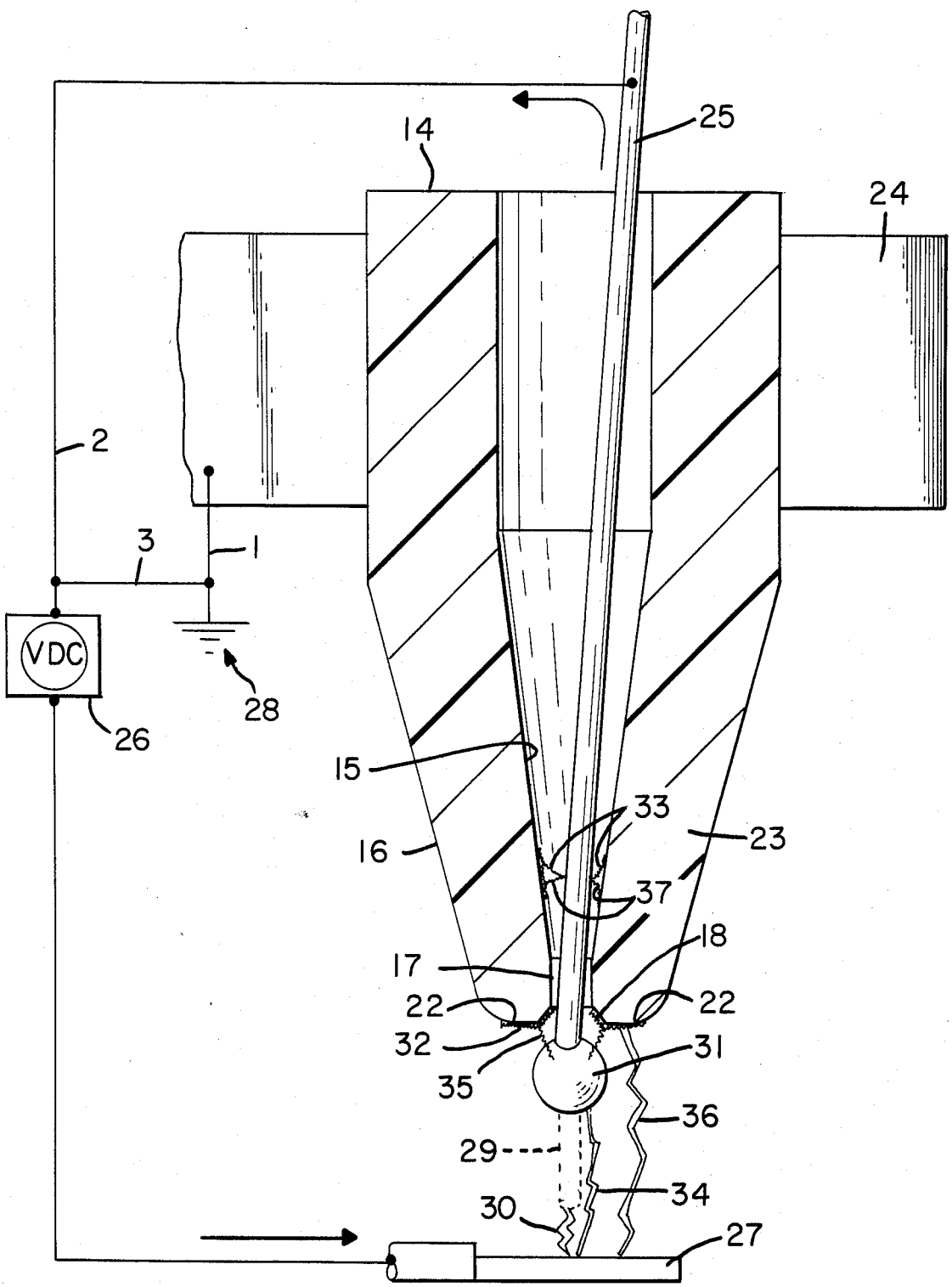
FIG. 1 is a simplified schematic representation illustrating a sectionalized view of a typical semiconductor wire bonding capillary in which an electric spark generator or EFO is used to form a ball.

The bonding wire 25 and the capillary holder or ultrasonic transducer 24 are electrically connected to ground 28 via conductors 1 and 2 and 3 respectively. An electric spark generator 26, commonly called an electronic flame-off (EFO) torch, usually of capacitive discharge type, is used to generate an electric spark discharge on the order of 700 to 2000 volts DC. One output of the generator 26 is connected to ground 28 via conductor 3, the other output being connected to a moveable EFO electrode 27. As is well known, the moveable EFO electrode 27 is normally retracted away from the capillary 23. When the ball 31 is to be formed, the EFO electrode 27 is moved beneath the capillary 23 and as close as possible thereto, but not touching the tail portion 29 of the bonding wire 25 protruding from the capillary 23. When the electrode 27 is properly positioned under the capillary 23, the spark generator 26 is triggered, the spark discharging an electric spark 30 to the bonding wire tail 29. The heat generated by the electric flow melts the bonding wire 25 at the tail 29 to form the ball 31 at the end of the wire 25. For this purpose, the tail 29 is shown in phantom since it no longer exists after the ball 31 has been formed.

Since the capillary bonding face 22, at the bottom portion of the capillary, is normally in contact with the bonding wire 25 as well as the metallization on package leads and possibly the metallization on the die during bonding, a thin metallic film build-up 32 occurs on the capillary bonding face 22. Also, as the wire 25 is fed out of the capillary 23, the wire rubs against the inner taper 15, causing a very thin metallic film build-up 33 thereon from the bonding wire 25 material to occur. Though the capillary 23 is electrically nonconductive, the thin metallic build-up 32 on the capillary bonding face 22, and the thin metallic build-up 33 on the inner taper area 15 are electrically conductive and offer potentially a lower path of resistance for the electric current from the EFO to ground potential 28. During the discharge of the electrical spark generator 26, the bonding wire 25 and the ball 31 are highly electrically charged. Sparking or electric arcing shown at 35 occurs from the ball 31 and/or the bonding wire 25 to the thin metallic build-up 32 on the capillary bonding face 22 and at 37 to the metallic build-up 33 on the inner taper area 15. Sparking or electrical arcing 36 can also occur directly from the EFO electrode 27 to the thin metallic build-up 32 on the capillary bonding face 22. At the point where the spark hits the metallic build-up 32 on the capillary bonding face 22, the metallic build-up is heated by the electric spark discharge and blasted away. The underlying non-electrically conductive capillary material is also destroyed or eroded with each spark and there is therefore gradual erosion of the inside chamfer 18 and the bonding face 22. The spark erosion of the capillary material is similar in nature to that resulting from erosion of metals by electrical discharge machining (EDM).

Figure 2:
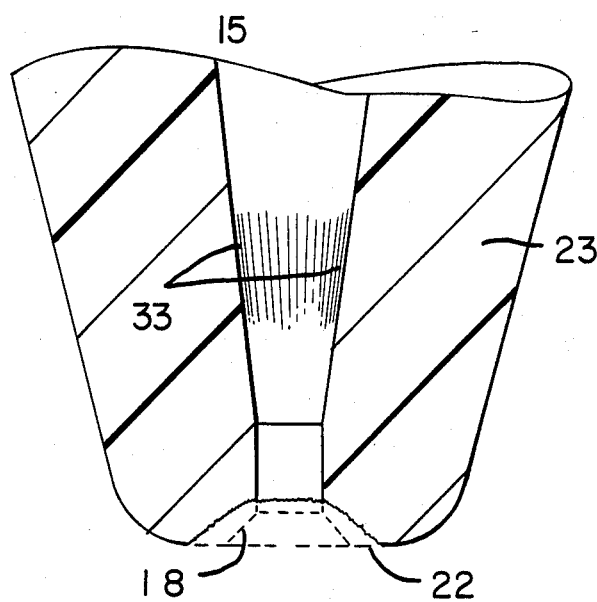
FIG. 2 is a cross-sectional view of a portion of a capillary tip as in FIG. 1 showing typical EFO erosion damage in the inside chamfer area of the capillary.

Referring now to FIG. 2, there is shown a sectionalized view of a wire bonding capillary 23 as in FIG. 1 formed from a non-electrically conductive material and showing the typical spark erosion damage 39 to the capillary bonding face 22. Normally, the greatest erosion of the capillary material is in the area of the inside chamfer 18 which is shown in phantom as is a portion of bonding face 22. In general, the inside chamfer area 18 is eroded to a shape similar in curvature to that of the ball 31 as illustrated in the eroded area 39.

Sparking or electrical arcing 37 as shown in FIG. 1, as stated above, also occurs to the thin metallic film build-up 33 in the inner taper area 15 where the wire 25 has rubbed against the taper area. This metallic build-up 33 is much less than the thin metallic build-up on the capillary bonding face 22. The inner taper area 15 is also farther removed from the spark origin from electrode 27 than is the capillary bonding face 22. Therefore, the sparking or electrical arcing 37 to the inner taper area 15 is less intense than that on the capillary bonding face 22. In general, the sparking 37 on the inner taper area 15 does not cause much erosion of the capillary material itself. However, it does cause a burning effect and a subsequent carbon-like build-up which tends to restrict the cross-sectional area of the bore of the capillary and tends to restrict the feeding or flow of the bonding wire 25 therethrough.

Figure 3:
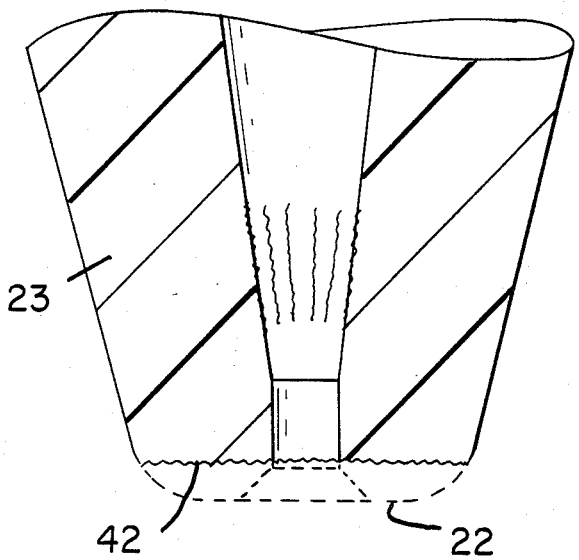
FIG. 3 is a cross-sectional view of a portion of a capillary tip showing the wire bonding capillary worn flat by EFO spark erosion.

If the metallic build-up 32 on the capillary bonding face 22 is sufficient (which can occur when bonding some metallizations, such as printed circuit board metallizations), then the capillary bonding face 22 becomes highly electrically conductive and results in more sparking directly to the capillary bonding face 22. The spark erosion will then tend to erode the capillary bonding face 22, shown in phantom in FIG. 3, flat as shown at 42, and remove a portion of the capillary face as shown.

Figure 4:
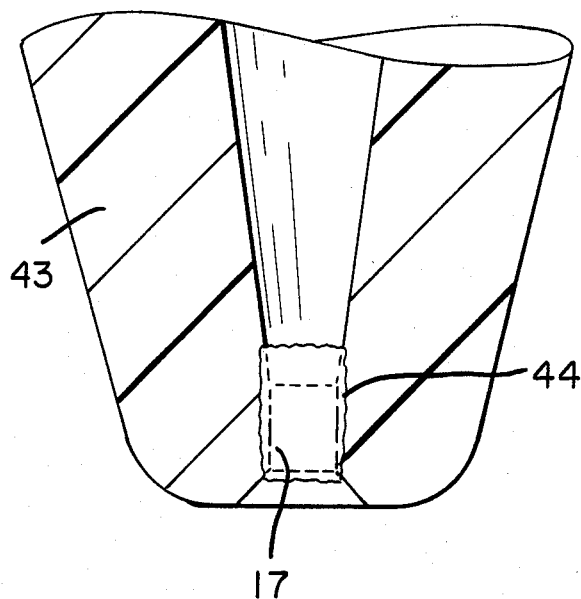
FIG. 4 is a cross-sectional view of a portion of a capillary tip showing typical EFO burn when the capillary is formed from an electrically conductive material.

If the capillary 43 is formed from electrically conductive materials, such as tungsten carbide or titanium carbide of the type shown in FIG. 4, then the electric spark erosion of the capillary is mainly in the bore 17, such erosion being shown at 44. The electrical energy seeks the path of least resistance and, in this case, it is through the bonding wire 25 to the side walls of the capillary bore 17 shown in phantom in FIG. 4, thereby causing erosion and enlargement of the bore at 44 as shown.

Figure 5:
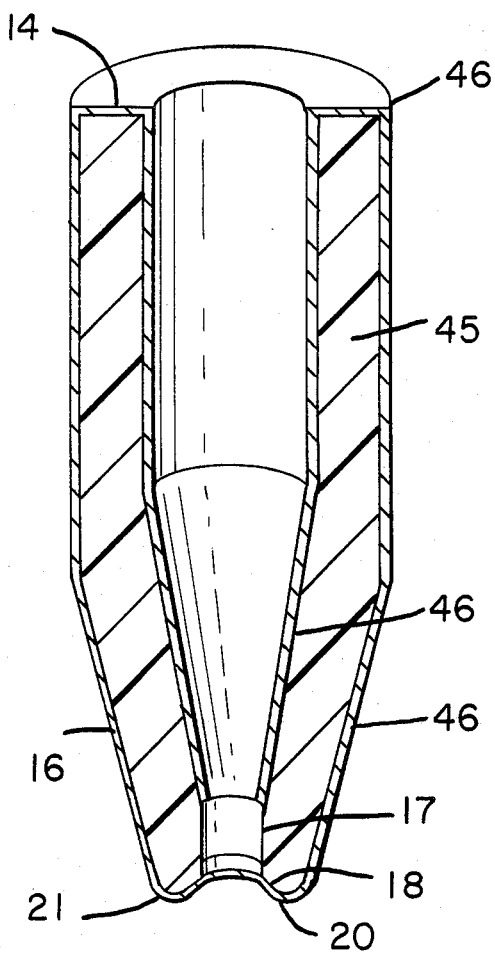
FIG. 5 is a cross-sectional view of a capillary formed in accordance with the present invention.

FIG. 5 is a cross-sectional view of half of a wire bonding capillary in accordance with the present invention. The wire bonding capillary 45 is formed from materials of the type discussed above with reference to FIG. 1. The formed wire bonding capillary 45 is coated or plated with an electrically conductive coating 46. In general, the electrically conductive coating 46 thickness need not exceed 0.0025 millimeters. The electrically conductive coating 46 must be thick enough to offer good adherence to the formed non-electrically conductive capillary material and thick enough to offer good electrical conductivity, these being the basic requirements of the coating.

The electrically conductive coating 46 on the outer surface of the capillary 45 offers the path of least electrical resistance for an electric spark discharge from the EFO to the electrically conductive coating 46 on the outside taper 16 directly adjacent to the bonding face 22 through the electrically conductive coating 46 on the outside surface to the ground terminal 28 as shown in FIG. 1.

It is understood at this point, in actual use, the capillary depicted in FIG. 5 will replace the capillary shown in FIG. 1 in all respects. Therefore, the current path from electrode 27 includes electrically conductive coating 46 to the capillary holder or ultrasonic transducer 24 and therefrom to ground 28. The electrically conductive coating 46 acts in the manner of a lightning rod attracting the electrical spark discharge away from the capillary bonding face 22, thereby protecting the capillary bonding face from spark erosion damage.

The electrically conductive coating 46 on the inside of the capillary 45 offers the path of least resistance and a good electrical return to a common electrical ground 28. Specifically, the electrical return to ground is from the bonding wire 25 to the electrically conductive coating 46 on the inner taper 15, through the electrically conductive coating 46 in the capillary bore, through the electrically conductive coating 46 on the back end 14, through the electrically conductive coating 46 on the outside of the capillary to the common electrically grounded capillary holder or ultrasonic transducer 24 of the bonding machine.

The electrically conductive coating 46 on the inside surfaces of the wire bonding capillary 45 offers electrical contact to the bonding wire 25, reducing electrical sparking or arcing to the back taper area 15 (see FIG. 1) and thereby reducing carbon-like build-up in the back taper area which can restrict the bonding wire feed out area.

In manufacturing practice, the electrically conductive coating 46 is applied to all surface areas of the formed non-electrically conductive wire bonding capillary 45. However, the electrically conductive coating 46 does not specifically need to be in the small capillary bore 17 nor the bonding face 22 which includes the inside chamfer 18, the face flat or taper angle 20 and partially the outside radius 21. To facilitate the manufacturing process, the electrically conductive coating can be applied to all surfaces of the wire bonding capillary as it is difficult to coat all surfaces with the exception of the bore 17 and the bonding face 22. If the electrically conductive coating is initially on all surfaces, including the small capillary bore 17 and the bonding face 22, then, when the wire bonding capillary is initially used, the electrical spark discharge will tend to slowly erode away the electrical coating in the small capillary bore 17 and the bonding face 22, exposing the non-electrically conductive formed material of the bonding face 22 and partially the outside radius 21. The electrically conductive coating 46 on outside taper 16, adjacent to the bonding face 22 acts as a lightning rod and attracts the electrical spark discharge away from the exposed non-electrically conductive formed capillary material of the bonding face 22, minimizing spark erosion damage.

The capillary 23 actually need not be coated on the bonding face 22 but only partially on the outer taper 16 adjacent directly to the capillary bonding face 22, which in some manner is electrically connected to ground 28, attracting the electrical spark discharge away from the bonding face 22, minimizing spark damage.

The entire outside taper 16 need not be completely coated but only the outside taper 16 area directly adjacent to the bonding face 22 which is then in some manner electrically connected to ground 28.

A typical realization of this invention would include a wire bonding capillary formed of fine grain high alumina ceramic of 99.8% $Al_2O_3$, coated with a thin electrically conductive layer of titanium nitride. The invention is not limited to the above selected materials, however.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A wire bonding capillary apparatus which includes in combination:
    (a) a capillary member formed of hard, electrically non-conductive material, said capillary including an internal bore extending axially of said capillary, said bore having a first cylindrical shape for a first portion thereof, a frustoconical shape for an adjacent portion thereof and a second cylindrical shape for a portion adjacent said frustoconical portion remote from said first cylindrical shape, the outer surface of said member having a cylindrical shape for a first portion thereof and a frustoconical shape for an adjacent portion thereof, and a rounded portion connecting said frustoconical shape on said outer surface, and
    (b) a continuous electrically conductive layer disposed on and adhered to the external surfaces of said bore and said outer surface of said capillary member, said conductive layer extending in said bore from substantially the outside edge of said second cylindrical shape portion to substantially the outside edge of said first cylindrical shape portion and extending on said outer portion from substantially the outside edge of said frustoconical shape portion to substantially the outside portion of said cylindrical shape portion.
2. A wire bonding capillary apparatus as set forth in claim 1 wherein said conductive layer is about 0.0025 millimeters in thickness.
3. A wire bonding capillary apparatus as set forth in claim 1 wherein said conductive layer is of substantially minimum thickness to obtain adherence to said capillary member and good electrical conductivity.
4. A wire bonding capillary apparatus as set forth in claim 1 further including means to connecting said layer to a source of reference potential.
5. A wire bonding capillary apparatus as set forth in claim 1 wherein said capillary member is formed substantially of fine grain alumina and said layer is formed of titanium nitride.
6. A wire bonding capillary apparatus which includes, in combination:
    (a) a capillary member formed of hard, electrically insulating material, said capillary including an internal bore extending axially entirely therethrough having a tip and a back end portion, and
    (b) a continuous electrically conductive layer disposed on and adhered to the external surfaces of said capillary member and extending from substantially said tip to substantially said back portion for transferring electrical charge from said tip to said back end portion, said layer being coupled to a source of reference potential.
7. A wire bonding capillary apparatus as set forth in claim 6 wherein said conductive layer is about 0.0025 millimeters in thickness.
8. A wire bonding capillary apparatus as set forth in claim 6 wherein said conductive layer is of substantially minimum thickness to obtain adherence to said capillary member and good electrical conductivity.
9. A wire bonding capillary apparatus as set forth in claim 6 further including means to connecting said layer to a source of reference potential.
10. A wire bonding capillary apparatus as set forth in claim 6 wherein said capillary member is formed substantially of fine grain alumina and said layer is formed of titanium nitride.
11. A wire bonding capillary apparatus which includes, in combination:
    (a) a capillary member formed of hard, electrically insulating material, said capillary including an internal bore extending axially entirely therethrough and having a tip and a back end portion, and
    (b) means extending from substantially said tip to substantially said back end portion for transferring electric charge from said tip to said back end portion.
12. A wire bonding capillary apparatus as set forth in claim 11 wherein said means is an electrically conductive layer entirely covering said tip.
13. A wire bonding capillary apparatus as set forth in claim 12 wherein said conductive layer is of substantially minimum thickness to obtain adherence to said capillary member and good electrical conductivity.
14. A wire bonding capillary apparatus as set forth in claim 13 further including means to connecting said layer to a source of reference potential.
15. A wire bonding capillary apparatus as set forth in claim 14 wherein said capillary member is formed substantially of fine grain alumina and said layer is formed of titanium nitride.
16. A wire bonding capillary apparatus as set forth in claim 13 wherein said capillary member is formed substantially of fine grain alumina and said layer is formed of titanium nitride.
17. A wire bonding capillary apparatus as set forth in claim 12 further including means to connecting said layer to a source of reference potential.

18. A wire bonding capillary apparatus as set forth in claim 17 wherein said capillary member is formed substantially of fine grain alumina and said layer is formed of titanium nitride.

19. A wire bonding capillary apparatus as set forth in claim 12 wherein said capillary member is formed substantially of fine grain alumina and said layer is formed of titanium nitride.

* * * * *